United States Patent
Hino et al.

(10) Patent No.: US 7,030,443 B2
(45) Date of Patent: Apr. 18, 2006

(54) MIM CAPACITOR

(75) Inventors: Takuo Hino, Osaka (JP); Yoshihisa Minami, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/501,865

(22) PCT Filed: Sep. 1, 2003

(86) PCT No.: PCT/JP03/11132

§ 371 (c)(1),
(2), (4) Date: Jul. 20, 2004

(87) PCT Pub. No.: WO2004/021439

PCT Pub. Date: Mar. 11, 2004

(65) Prior Publication Data

US 2005/0110068 A1    May 26, 2005

(30) Foreign Application Priority Data

Aug. 30, 2002 (JP) ............... 2002-254370
Nov. 6, 2002 (JP) ............... 2002-322244

(51) Int. Cl.
H01L 27/108 (2006.01)
H01L 29/76 (2006.01)
H01L 29/00 (2006.01)
H01G 4/00 (2006.01)
H01G 4/005 (2006.01)

(52) U.S. Cl. ............... 257/306; 257/296; 257/531; 257/532; 361/301.2; 361/301.4; 361/303

(58) Field of Classification Search ............... 257/296, 257/306, 532, 531; 361/301.4, 301.2
See application file for complete search history.

(56) References Cited

U.S. PATENT DOCUMENTS

| 4,323,948 A | * | 4/1982 | Mercier et al. ............ 361/315 |
| 4,918,454 A | | 4/1990 | Early et al. |
| 5,220,483 A | | 6/1993 | Scott |
| 5,872,695 A | * | 2/1999 | Fasano et al. ........... 361/301.4 |
| 6,111,742 A | | 8/2000 | Bonhoure et al. |
| 6,198,153 B1 | | 3/2001 | Liu et al. |
| 6,235,573 B1 | * | 5/2001 | Lee et al. ............ 438/241 |
| 6,285,050 B1 | * | 9/2001 | Emma et al. ............ 257/296 |
| 6,387,770 B1 | * | 5/2002 | Roy ............... 438/384 |
| 2003/0089937 A1 | | 5/2003 | Yamauchi et al. |

FOREIGN PATENT DOCUMENTS

| JP | 5-235266 | 9/1993 |
| JP | 5-283614 | 10/1993 |

(Continued)

*Primary Examiner*—Eddie Lee
*Assistant Examiner*—Samuel A. Gebremariam
(74) *Attorney, Agent, or Firm*—Hamre, Schumann, Mueller & Larson, P.C.

(57) ABSTRACT

A MIM (metal-insulator-metal) capacitor is provided with a substrate; a first metal area; a second metal area formed between the substrate and the first metal area; and a first insulating layer formed between the first metal area and the second metal area; wherein a capacitance value is determined by opposing surface areas of the first metal area and the second metal area; and the MIM capacitor is further provided with: a third metal area formed between the second metal area and the substrate; and a second insulating layer formed between the third metal area and the second metal area; wherein the third metal area is connected to a ground potential.

4 Claims, 10 Drawing Sheets

FOREIGN PATENT DOCUMENTS

| | | |
|---|---|---|
| JP | 7-326712 | 12/1995 |
| JP | 11-26290 | 1/1999 |
| JP | 2001-60661 | 3/2003 |
| JP | 2003-152085 | 5/2003 |

* cited by examiner

MIM CAPACITOR

TECHNICAL FIELD

The present invention relates to MIM (metal-insulator-metal) capacitors that are provided with a substrate, a first metal area, a second metal area formed between the substrate and the first metal area, and a first insulating layer formed between the first metal area and the second metal area, wherein a capacitance value is determined by the opposing surface areas of the first metal area and the second metal area.

BACKGROUND ART

Figure 18:
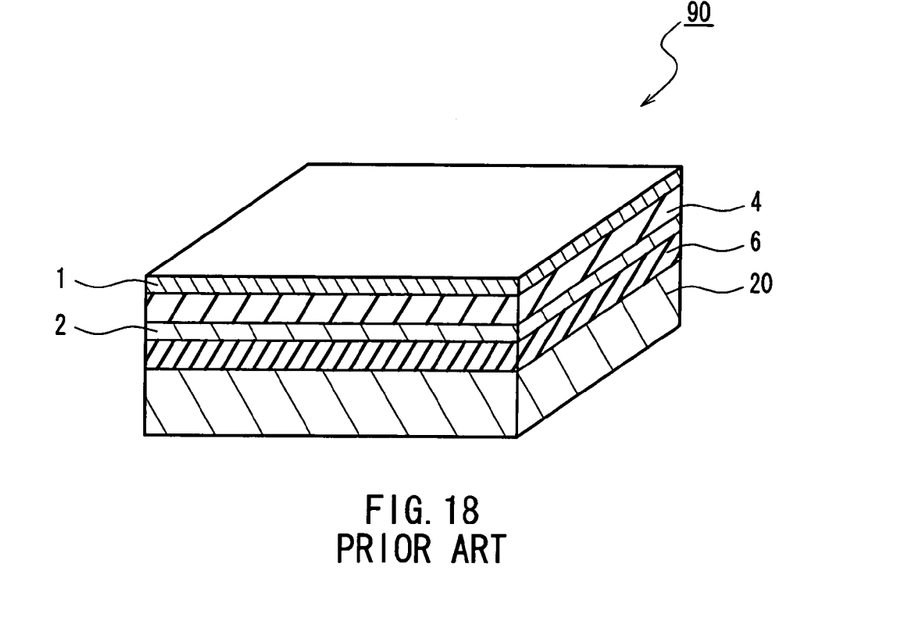
FIG. 18 is a cross-sectional perspective view of a configuration of a conventional MIM capacitor.

A configuration of a conventional MIM capacitor is disclosed in JP H7-326712A. FIG. 18 is a cross-sectional perspective view of a configuration of a conventional MIM capacitor 90.

The MIM capacitor 90 is provided with a substrate 20. The substrate 20 is made of an epitaxial layer or a substrate. Laminated in order on the substrate 20 are an insulating body 6, a metal area 2, an insulating body 4, and a metal area 1. In this way, the MIM capacitor 90 has a configuration in which the insulating body 4 is sandwiched by the metal area 1 and the metal area 2, and the capacitance value of the MIM capacitor 90 is determined by the opposing surface areas of the metal area 1 and the metal area 2.

Figure 19:
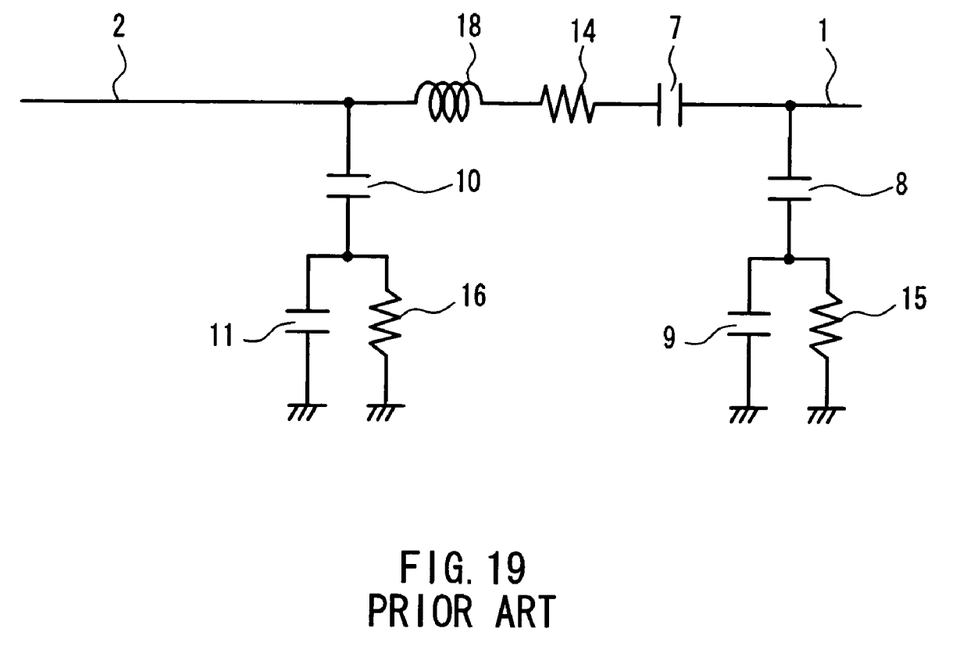
FIG. 19 is a circuit diagram showing a configuration of an equivalent circuit of a conventional MIM capacitor.

FIG. 19 is a circuit diagram showing the configuration of an equivalent circuit of a conventional MIM capacitor 90. The equivalent circuit includes a capacitor 7 that has a capacitance value determined by the opposing surface areas of the metal areas 1 and 2. In this equivalent circuit, in which parasitic elements also are represented, a resistor 14 that represents the parasitic resistance of the metal area 1, which constitutes an upper portion electrode, and the metal area 2, and an inductor 18 that represents the parasitic inductance of the metal areas 1 and 2 are serially connected to one side of the capacitor 7.

A capacitor 8 represents the capacitance between the metal area 1, which constitutes an upper portion electrode, and the substrate 20. And a capacitor 10 represents the capacitance between the metal area 2, which forms a lower portion electrode, and the substrate 20. The capacitors 9 and 11 express the capacitance of the semiconductor in the substrate 20. The resistors 15 and 16 represent the resistance of the semiconductor in the substrate 20.

A MIM capacitor is disclosed in JP H5-283614A that is provided with a three layer structure and is similar to the configuration described above with reference to FIG. 18.

MIM capacitors such as this are generally often used when capacitance is necessary in a high frequency circuit. This is because the values of the parasitic elements occurring between the silicon substrate (epitaxial layer (hereafter "substrate")) and the electrodes in a MIM capacitor configured in this way are relatively small compared to the capacitance of other configurations, and therefore there is little circuit deterioration.

Circuits that operate in the high frequency gigahertz (GHz) band are increasing recently in the communications field, thus bringing about a necessity for increasingly high performance in MIM capacitors. For example, with voltage controlled oscillators (hereafter, also "VCO"), the Q value of the MIM capacitor is one of the important elements determining the performance of the voltage controlled oscillator.

However, with the above-described conventional configuration of MIM capacitors, there is the problem that the Q value of the capacitance of the parasitic elements between the metal areas 1 and 2 and the substrate 20 is low, and therefore the Q value of the MIM capacitor as a whole, which includes the parasitic elements, also is low.

The Q value of a MIM capacitor is expressed, for example, by the formula 1 below, in which the capacitance value is C, the serial loss resistance inside the MIM capacitor is R, and the frequency at which the MIM capacitor is used is ω (=2×π×f: frequency).

$$Q=1/(R\times\omega\times C) \quad \text{(Formula 1)}$$

Deterioration in the Q value of the MIM capacitor here invites deterioration in the performance of the VCO. For this reason, there is a need for the Q value of MIM capacitors to be further increased. In order to further increase the Q value of MIM capacitors, it is necessary to improve the Q value of the parasitic capacitance between the metal areas and the substrate arranged in the MIM capacitor.

An object of the present invention is to provide a high-performance MIM capacitor.

DISCLOSURE OF INVENTION

A MIM (metal-insulator-metal) capacitor according to the present invention is provided that has: a substrate; a first metal area; a second metal area formed between the substrate and the first metal area; and a first insulating layer formed between the first metal area and the second metal area; wherein a capacitance value is determined by opposing surface areas of the first metal area and the second metal area; and is further provided with: a third metal area formed between the second metal area and the substrate; and a second insulating layer formed between the third metal area and the second metal area; wherein the third metal area is connected to a ground potential.

Further still, at least one metal-free area is formed in the third metal area to make the Q value variable.

Another MIM capacitor according to the present invention is a MIM (metal-insulator-metal) capacitor provided with: a substrate; a first metal area; a second metal area formed between the substrate and the first metal area; and a first insulating layer formed between the first metal area and the second metal area; wherein a capacitance value is determined by opposing surface areas of the first metal area and the second metal area; and is further provided with: a diffusion layer having a conductive property formed between the second metal area and the substrate, and a second insulating layer formed between the diffusion layer and the second metal area, wherein the diffusion layer is connected to a ground potential.

Still another MIM capacitor according to the present invention is provided with: a substrate; a first metal area and a second metal area formed respectively opposing the substrate; a third metal area formed between the first metal area and the substrate so as to oppose the first metal area; a fourth metal area formed between the second metal area and the substrate so as to oppose the second metal area; and an insulating film formed between the first metal area and the third metal area, and between the second metal area and the fourth metal area; wherein a first capacitance value is determined by opposing surface areas of the first metal area and the third metal area, and a second capacitance value is determined by opposing surface areas of the second metal area and the fourth metal area; and is further provided with a fifth metal area formed in an electrically floating state between the third and fourth metal areas and the substrate so as to oppose both the third metal area and the fourth metal area.

Still another MIM capacitor according to the present invention is provided with: a substrate; a first metal area and a second metal area formed respectively opposing the substrate; a third metal area formed between the first and second metal areas and the substrate so as to oppose both the first metal area and the second metal area; wherein a first capacitance value is determined by opposing surface areas of the first metal area and the third metal area, and a second capacitance value is determined by opposing surface areas of the second metal area and the third metal area; and wherein the third metal area is formed so as to be in an electrically floating state.

BRIEF DESCRIPTION OF DRAWINGS

FIG. 8($a$) is a top view of a metal area arranged in the MIM capacitor according to Embodiment 1; FIG. 8($b$) is a top view of metal areas arranged in the MIM capacitor according to Embodiment 2; and FIG. 8($c$) is a top view of metal areas arranged in the MIM capacitor according to Embodiment 3.

BEST MODE FOR CARRYING OUT THE INVENTION

A MIM (metal-insulator-metal) capacitor according to an embodiment of the present invention is provided with a substrate; a first metal area; a second metal area formed between the substrate and the first metal area; and a first insulating layer formed between the first metal area and the second metal area; wherein a capacitance value is determined by opposing surface areas of the first metal area and the second metal area; and is further provided with: a third metal area formed between the second metal area and the substrate; and a second insulating layer formed between the third metal area and the second metal area; wherein the third metal area is connected to a ground potential. For this reason, the first and second metal areas do not receive the influence of the parasitic elements present between the third metal area and the substrate. As a result of this, it is possible to achieve a MIM capacitor that has excellent circuit performance.

In this embodiment, it is preferable that at least one metal-free area is formed in the third metal area from a surface of the third metal area opposing the second metal area toward a surface opposing the substrate, and it is preferable that the at least one metal-free area formed in the third metal area is made of a plurality of metal-free areas.

It is preferable that the plurality of metal-free areas are formed in parallel.

It is preferable that the plurality of metal-free areas are formed intersecting.

It is preferable that at least one of the metal-free areas is formed so as to be partitioned symmetrically to the third metal area.

Another MIM capacitor according to the present embodiment is provided with a diffusion layer having conductive property formed between the second metal area and the substrate, and is connected to a ground potential. For this reason, the first and second metal areas do not receive the influence of the parasitic elements present between the diffusion layer and the substrate. As a result of this, it is possible to achieve a MIM capacitor that has excellent circuit performance.

Still another MIM capacitor according to the present embodiment is provided a first metal area and a second metal area on a same surface, and is provided with a substrate; the first metal area and the second metal area formed respectively opposing the substrate; a third metal area formed between the first metal area and the substrate so as to oppose the first metal area; a fourth metal area formed between the second metal area and the substrate so as to oppose the second metal area; and an insulating film formed between the first metal area and the third metal area, and between the second metal area and the fourth metal area; wherein a first capacitance value is determined by opposing surface areas of the first metal area and the third metal area, and a second capacitance value is determined by opposing surface areas of the second metal area and the fourth metal area; and is further provided with a fifth metal area formed in an electrically floating state between the third and fourth metal areas and the substrate so as to oppose both the third metal area and the fourth metal area. For this reason, the first and third metal areas as well as the second and fourth metal areas do not receive the influence of the parasitic elements present between the fifth metal area and the substrate. As a result of this, it is possible to achieve a MIM capacitor that has excellent circuit performance.

In this embodiment, it is preferable that the fifth metal area is connected to a ground potential.

It is preferable that the fifth metal area is connected to the ground potential at a connection point such that impedance to the third metal area and impedance to the fourth metal area are substantially equivalent.

Still another MIM capacitor according to the present embodiment is provided with: a substrate; a first metal area and a second metal area formed respectively opposing the substrate; and a third metal area formed between the first and second metal areas and the substrate so as to oppose both the first metal area and the second metal area; wherein a first capacitance value is determined by opposing surface areas of the first metal area and the third metal area, and a second capacitance value is determined by opposing surface areas of the second metal area and the third metal area; and wherein the third metal area is formed so as to be in an electrically floating state. For this reason, the first, second, and third metal areas do not receive the influence of the parasitic elements present between the third metal area and the substrate. As a result of this, it is possible to achieve a MIM capacitor that has excellent circuit performance.

In this embodiment, it is preferable that the third metal area is connected to a ground potential.

It is preferable that the third metal area is connected to the ground potential at a connection point such that impedance to the first metal area and impedance to the second metal area are substantially equivalent.

The following is a description of preferred embodiments of the present invention with reference to the accompanying drawings.

Embodiment 1

Figure 1:
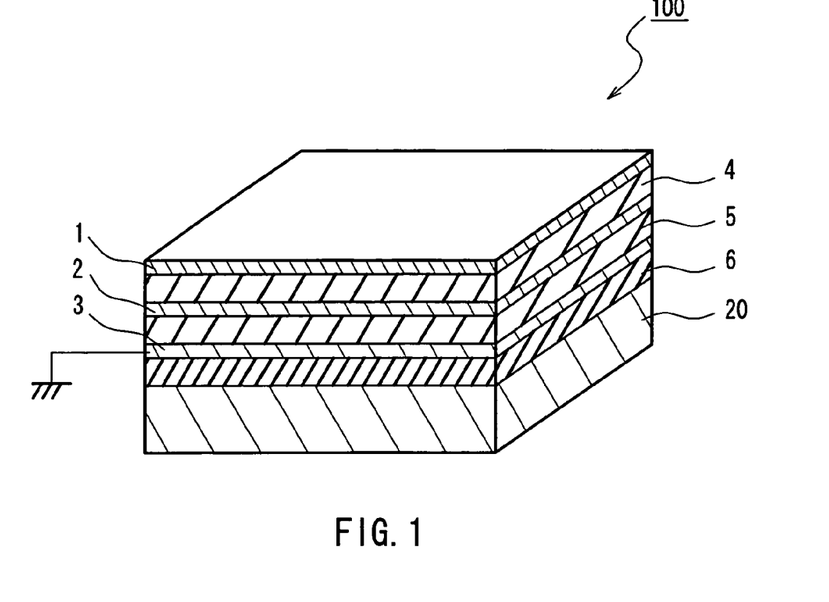
FIG. 1 is a cross-sectional perspective view of a configuration of a MIM capacitor according to a first embodiment.

FIG. 1 is a cross-sectional perspective view of a configuration of a MIM capacitor 100 according to Embodiment 1. The MIM capacitor 100 is provided with a substrate 20. The substrate 20 is made of a silicon substrate, which is formed by an epitaxial layer. Formed in order on the substrate 20 are an insulating layer 6, a metal area 3, an insulating layer 5, a metal area 2, an insulating layer 4, and a metal area 1.

The metal areas 1 and 2 serve as the terminals of the MIM capacitor 100. The capacitance value of the MIM capacitor 100 is determined by the opposing surface areas of the metal areas 1 and 2. The metal area 3 is connected to a ground potential.

Figure 2:
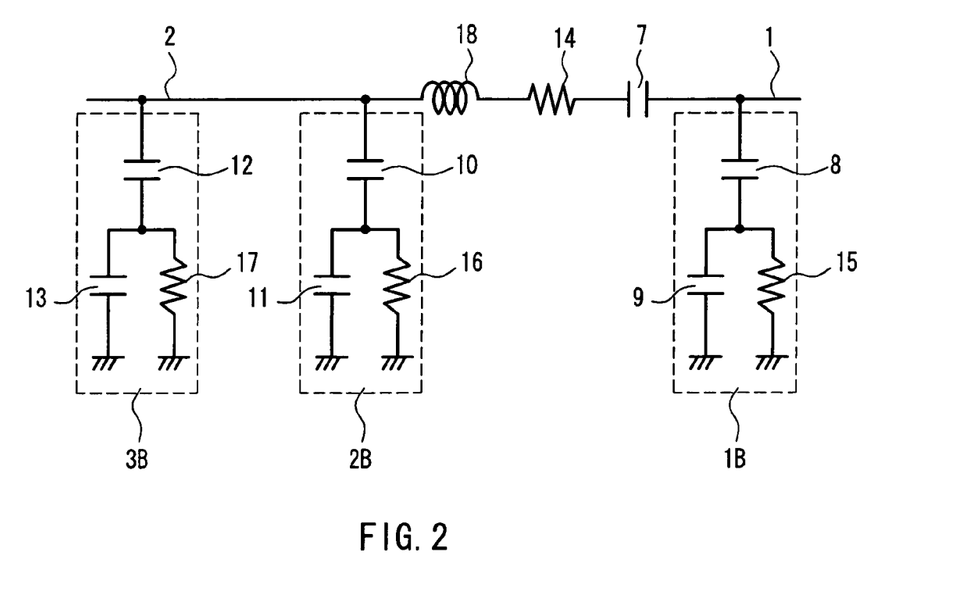
FIG. 2 is a circuit drawing showing a configuration of an equivalent circuit of the MIM capacitor according to Embodiment 1.

FIG. 2 is a circuit drawing showing a configuration of an equivalent circuit of the MIM capacitor 100 according to Embodiment 1. The equivalent circuit is provided with a capacitor 7 that has a capacitance value determined by the opposing surface areas of the metal areas 1 and 2. In this equivalent circuit, in which parasitic elements also are represented, a resistor 14 that represents the parasitic resistance of the metal area 1, which forms an upper portion electrode, and an inductor 18 that represents the parasitic inductance of the metal area 1, are serially connected to one side of the capacitor 7. The metal area 2 is connect to the inductor 18. The metal area 1 is connected to the other side of the capacitor 7.

A circuit 1B that represents the parasitic element between the metal area 1 and the substrate 20 is connected to the metal area 1. The circuit 1B includes a capacitor 8 that is connected to the metal area 1. A capacitor 9 and a resistor 15 are serially connected to the capacitor 8, and the capacitor 9 and the resistor 15 are connected in parallel.

A circuit 2B that represents the parasitic element between the metal area 2 and the substrate 20 is connected to the metal area 2. The circuit 2B includes a capacitor 10 that is connected to the metal area 2. A capacitor 11 and a resistor 16 are serially connected to the capacitor 10, and the capacitor 11 and the resistor 16 are connected in parallel.

A further circuit 3B that represents the parasitic element between the metal area 3 and the substrate 20 is connected to the metal area 2. The circuit 3B includes a capacitor 12 that is connected to the metal area 2. A capacitor 13 and a resistor 17 are serially connected to the capacitor 12, and the capacitor 13 and the resistor 17 are connected in parallel. The capacitor 12 represents the capacitance between the metal area 3 and the substrate 20, and the loss resistance of the capacitor 12 is represented by the resistor 17.

Figure 3:
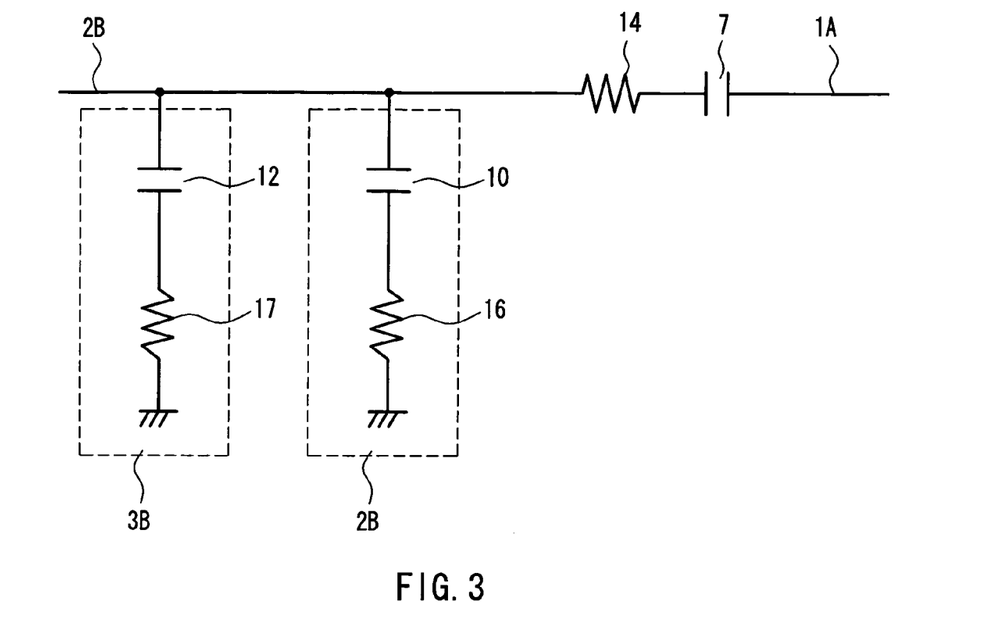
FIG. 3 is a circuit diagram showing a configuration of an equivalent circuit made of only parasitic elements that have a large influence contained in the MIM capacitor according to Embodiment 1.

In order to investigate the influence of these parasitic elements, parasitic elements with little influence were excluded from consideration. FIG. 3 is a circuit diagram showing a configuration of an equivalent circuit including only the parasitic elements that have a large influence contained in the MIM capacitor according to Embodiment 1. The influence of the inductor 18 is small, and the influence of the capacitors 8 and 9, in which the parasitic capacitance between the metal area 1 and the substrate 20 is represented, is also small, as is the influence of the capacitors 11 and 13, and therefore these elements are omitted from the equivalent circuit shown in FIG. 3.

As stated above, the metal area 3 is grounded, and an insulating layer 5 is formed between the grounded metal area 3 and the metal area 2. For this reason, the resistor 17 has only the metal resistance of the metal areas 2 and 3, which is smaller than that of the resistor 16. Accordingly, the Q value between the metal areas 2 and 3 is higher than the Q value between the metal area 2 and the substrate 20.

With Embodiment 1 described above, the metal area 3 formed between the metal area 2 and the substrate 20 is connected to a ground potential. For this reason, the metal areas 1 and 2 do not receive the influence of the parasitic elements that are present between the metal area 3 and the substrate 20. As a result of this, it is possible to achieve a MIM capacitor that has excellent circuit performance.

Embodiment 2

Figure 4:
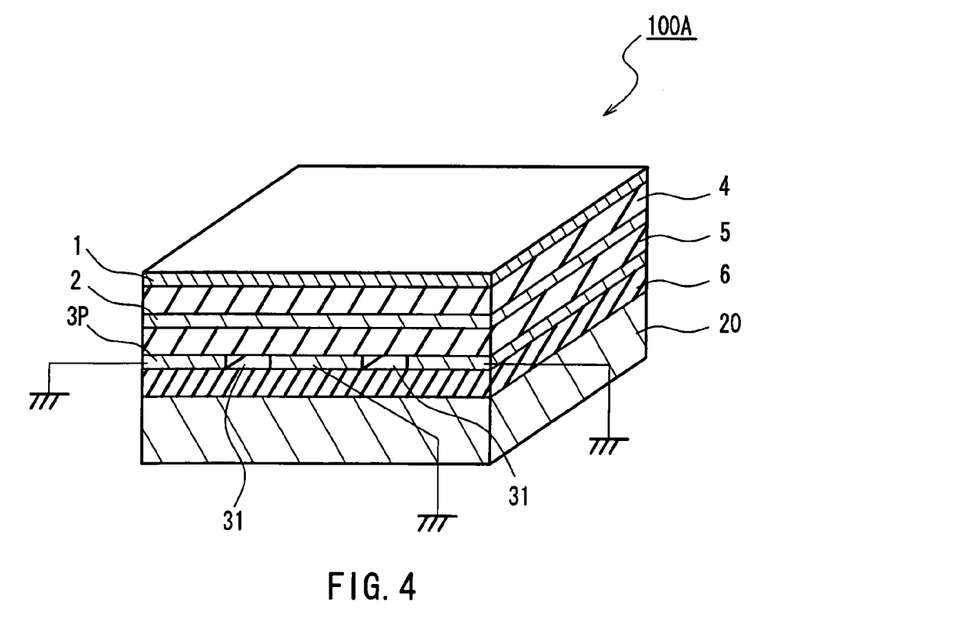
FIG. 4 is a cross-sectional perspective view of a configuration of a MIM capacitor according to Embodiment 2.

FIG. 4 is a cross-sectional perspective view of a configuration of a MIM capacitor 100A according to Embodiment 2. The same reference numbers are used for structural elements here that are the same as structural elements of the MIM capacitor 100 according to Embodiment 1, which was described with reference to FIG. 1. Accordingly, a detailed description of those structural elements is omitted here.

The difference from the MIM capacitor 100 according to Embodiment 1 is that metal areas 3P are formed here instead of the metal area 3. The metal areas 3P are provided with two metal-free areas 31. In this way, the surface area of the metal areas 3P opposing the metal area 2 is made smaller than the surface area of the metal area 3 that opposes the metal area 2 in the above-described first embodiment by the parallel surface area portions of the metal-free areas 31 in the metal area 2.

An equivalent circuit of the MIM capacitor 100A according to Embodiment 2 is the same as the equivalent circuit of the MIM capacitor 100 according to Embodiment 2 described above with reference to FIG. 3. The parasitic capacitance between the metal area 2 and the substrate 20 positioned above and below the metal-less areas 31 correspond to the capacitor 10 and the resistor 16.

Figure 5:
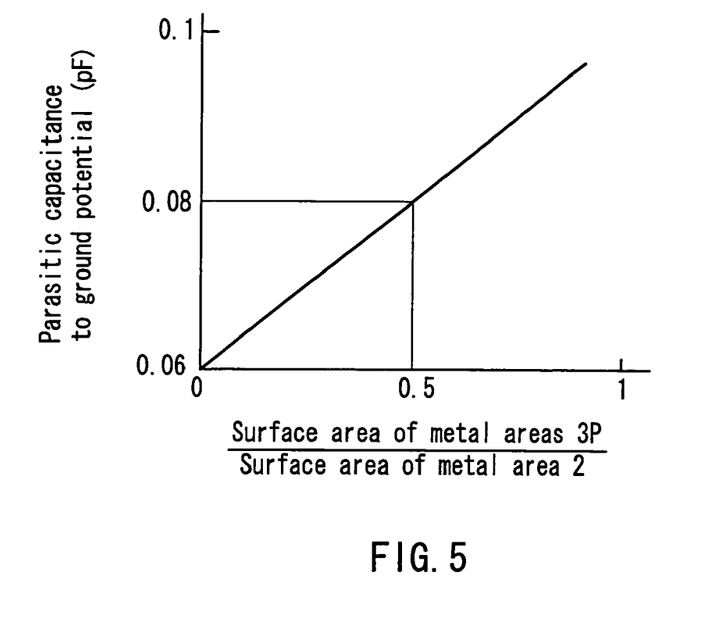
FIG. 5 is a graph showing the relationship between the parasitic capacitance to the ground potential and the proportion of surface area between the metal areas arranged in the MIM capacitor according to Embodiment 2.
Figure 6:
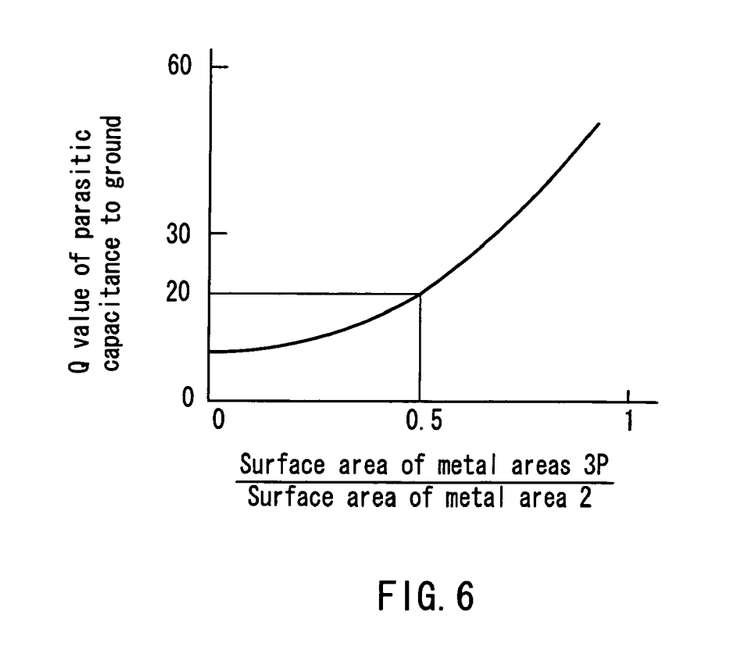
FIG. 6 is a graph showing the relationship between the Q value of the parasitic capacitance and the proportion of surface area between the metal areas arranged in the MIM capacitor according to Embodiment 2.

FIG. 5 is a graph showing the relationship between the parasitic capacitance to the ground potential and the proportion of surface area between the metal area 2 and the metal area 3P arranged in the MIM capacitor 100A according to Embodiment 2. FIG. 6 is a graph showing the relationship between the Q value of the parasitic capacitance and the proportion of surface area between the metal area 2 and the metal areas 3P arranged in the MIM capacitor 100A.

It is possible to control the Q value of the parasitic capacitance against ground for the metal area 2 and the parasitic capacitance value to the ground potential by forming metal-free areas in the metal areas 3P and adjusting the surface area of the faces of the metal areas 3P parallel to the metal area 2. For example, the ratio (here given as "A") of the surface area of the metal areas 3P to the surface area of the metal area 2, the Q value of the parasitic capacitance, and the parasitic capacitance are calculated.

When the parasitic capacitance is given as 0.1 picofarad (pF) when the Q value of the parasitic capacitance between the metal areas 2 and 3, which is determined by the capacitor 12 and the resistor 17, is given as Q1=50, the Q value of the parasitic capacitance determined by the parasitic capacitor 10 between the metal area 3 and the substrate 20, and the resistor 16 is given as Q2=10, the capacitor 10 of the metal area 2 when the capacitor 7 is 1 picofarad (pF) is given as 0.06 picofarad (pF), and when the metal area 3 is formed having the same surface area as the surface area of the metal area 2, a parasitic capacitor is given as 0.1 picofarad (pF), a total C of the parasitic capacitance of the ground potential for the metal area 2 and a total Q of the parasitic capacitance are expressed by the following formulas 2 and 3.

$$C = C_1 \times A + C_2 \times (1-A) \quad \text{(Formula 2)}$$

$$Q = (Q_1 \times Q_2 \times A \times C_1 + Q_1 \times Q_2 \times (1-A) \times C_2) \div (Q_1 \times (1-A) \times C_2 + Q_2 \times A \times C_1) \quad \text{(Formula 3)}$$

When specific values are assigned in the above-described formulas 2 and 3 to calculate the total C of the parasitic capacitance of the ground potential for the metal area 2 and the total Q of the parasitic capacitance, the following is obtained:

$$C = 0.1 \times A + 0.06 \times (1-A) \text{(pF)}$$

$$Q = (50 \times 10 \times A \times 0.1 + 50 \times 10 \times (1-A) \times 0.06) \div (50 \times (1-A) \times 0.06 + 10 \times A \times 0.1)$$

The results of the total C of the parasitic capacitance of the ground potential for the metal area 2 is shown in FIG. 5 and the results of the total Q of the parasitic capacitance is shown in FIG. 6.

As shown in FIG. 6, when it is desired to set the Q value of the parasitic capacitance to 20 for example, the ratio of the surface area of the metal areas 3P to the surface area of the metal area 2 should be set to 0.5. That is, half the surface area of the metal area 2 should be shielded by the metal areas 3P. The ground capacitance C at this time is 0.08 picofarads (pF).

In this way, it is possible to adjust the Q value and the parasitic capacitances to the ground potential by adjusting the surface area of the metal areas 3P by forming the metal areas 3P with metal-free areas.

In Embodiment 2, an example was shown in which the metal-free areas 31 are hollow. However, the present invention is not limited to this. The metal-free areas 31 may be formed with an insulating material. This is also true for Embodiment 3 to be discussed.

Embodiment 3

Figure 7:
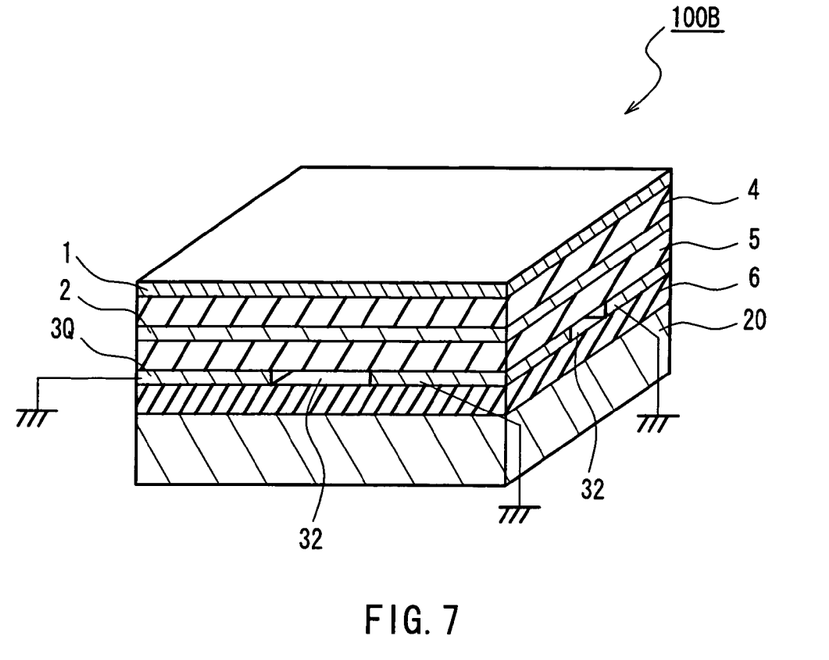
FIG. 7 is a cross-sectional perspective view and a top view of a configuration of a MIM capacitor according to Embodiment 3.

FIG. 7 is a cross-sectional perspective view of a configuration of a MIM capacitor 100B according to Embodiment 3. The same reference numbers are used for structural elements here that are the same as structural elements of the MIM capacitor 100 according to Embodiment 1, which was described with reference to FIG. 1. Accordingly, a detailed description of those structural elements is omitted here.

The use of circuits that operate in the high frequency gigahertz band is increasing recently in the communications field, thus bringing about a necessity in MIM capacitors for increasingly high performance. For example, when used in matching circuits such as input/output circuits, the loss due to the resistance component of the parasitic elements is a problem, and when used in voltage controlled oscillators, the resistance component of the parasitic elements invites deterioration in the Q value and worsening of the performance of the oscillator. Furthermore, when used in signal lines and the like, fluctuation in the time constant of the parasitic elements causes fluctuation in the amount of delay in the transmitted signals, thus producing problems such as system instability.

As in the above-described first embodiment described with reference to FIG. 1, with a configuration in which the grounded metal area 3 is added between the metal area 2 and the semiconductor substrate 20, it is possible to shield the metal area 2 from the semiconductor substrate 20 and change the parasitic capacitance added to the metal area 2 to a capacitance that has no loss resistance and little unevenness. Therefore, the performance of the capacitor 7 shown in FIG. 2 can be improved.

The difference from the MIM capacitor 100 according to Embodiment 1 is that metal areas 3Q are formed here instead of the metal area 3. Two spaces that are parallel to the surface of the metal area 2 are formed intersecting each other in the metal areas 3Q. In this way, the surface area of the metal areas 3P opposing the metal area 2 is made smaller than the surface area of the metal area 3 that opposes the metal area 2 in the above-described first embodiment by the surface area of two rows of metal-free areas 32. The two rows of metal-free areas 32 are formed intersecting each other in consideration of the layout balance so as to avoid fluctuation in the Q value in the surface of the MIM capacitor.

Figure 8:
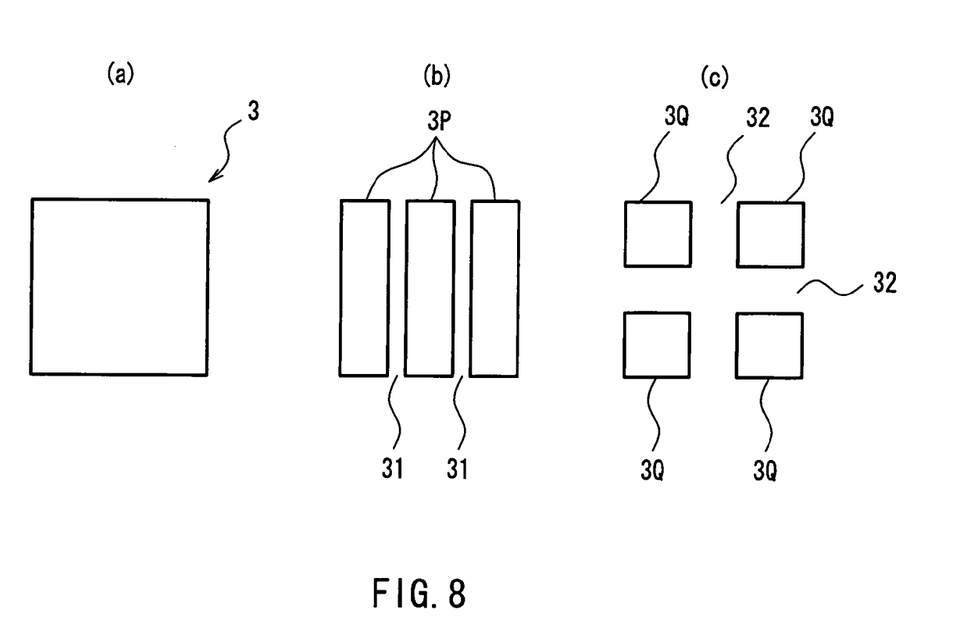

FIG. 8(a) is a top view of the metal area 3 arranged in the MIM capacitor 100 according to Embodiment 1. FIG. 8(b) is a top view of the metal areas 3P arranged in the MIM capacitor 100A according to Embodiment 2. FIG. 8(c) is a top view of the metal areas 3Q arranged in the MIM capacitor 100B according to Embodiment 3.

The metal area 3 arranged in the MIM capacitor 100 has a surface area that does not include metal-free areas and has the same surface area as the metal area 2. The metal areas 3P arranged in the MIM capacitor 100A have two rows of metal-free areas 31 formed in parallel. The metal areas 3Q arranged in the MIM capacitor 100B have two rows of metal-free areas 32 formed perpendicularly. However, the present invention is not limited to these. The number of metal-free areas formed in the metal area also may be three or more. Furthermore, the distance between the metal-free areas 31 that are formed in parallel may be freely altered. Further still, examples were shown in which the shape of the metal areas was rectangular, but shapes such as circular shapes are also possible. Moreover, it is also possible to provide a further different electrode on the metal area 1 that forms the upper portion electrode.

Embodiment 4

Figure 9:
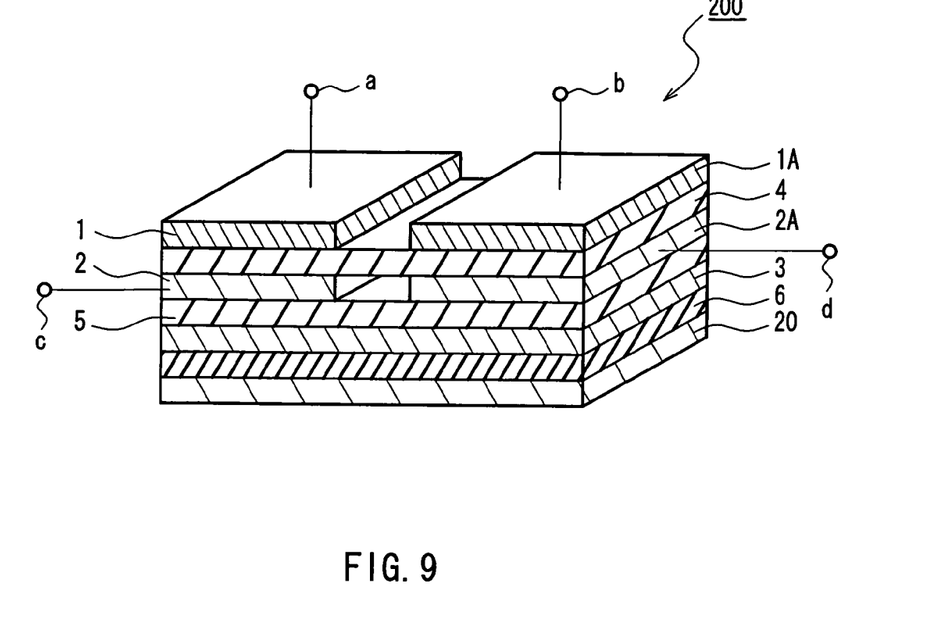
FIG. 9 is a cross-sectional perspective view of a configuration of a MIM capacitor according to Embodiment 4.

FIG. 9 is a cross-sectional perspective view of a configuration of a MIM capacitor 200 according to Embodiment 4. The MIM capacitor 200 is provided with a semiconductor substrate 20. Formed in order on the semiconductor substrate 20 are an insulating layer 6, a metal area 3, and an insulating layer 5.

A metal area 2 and a metal area 2A are formed with a suitable spacing on the insulating layer 5. An insulating layer 4 is formed on the metal areas 2 and 2A. A metal area 1 is formed opposing the metal area 2 and sandwiching the insulating layer 4. And a metal area 1A is formed opposing the metal area 2A and sandwiching the insulating layer 4.

Figure 10:
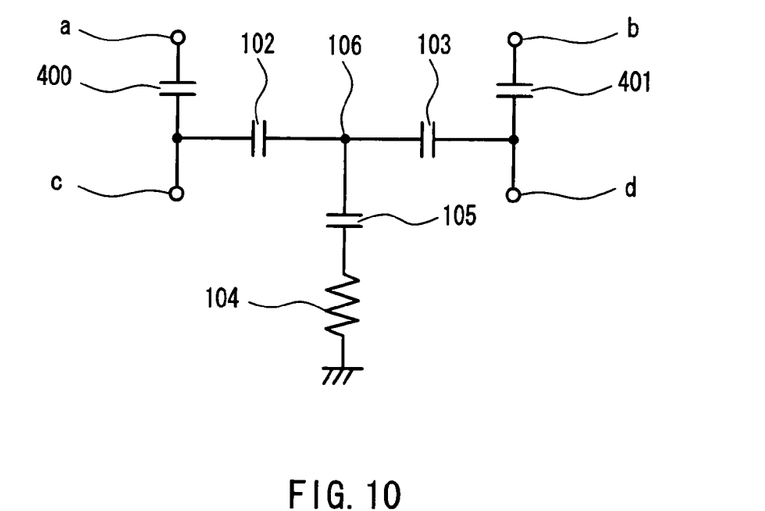
FIG. 10 is a circuit drawing showing a configuration of an equivalent circuit of a MIM capacitor according to Embodiment 4.

FIG. 10 is a circuit drawing showing a configuration of an equivalent circuit of the MIM capacitor 200. The equivalent circuit is provided with a capacitor 400 that is configured by metal areas 1 and 2, and a capacitor 401 that is configured by metal areas 1A and 2A. A capacitor 102 is formed at the capacitor 400. The capacitor 102 is a capacitor added to the capacitor 400 as a parasitic element between the metal areas 2 and 3. A capacitor 103 is formed between the capacitors 102 and 401. The capacitor 103 is a capacitor added to the capacitor 401 as a parasitic element between the metal areas 2A and 3.

A capacitor 105 is formed at the capacitors 102 and 103. The capacitor 105 is a parasitic capacitor between the metal area 3 and the semiconductor substrate 20. A resistor 104 of the internal loss of the parasitic capacitance of the capacitor 105 is present at the capacitor 105. A point 106 corresponds to the metal area 3.

Figure 11:
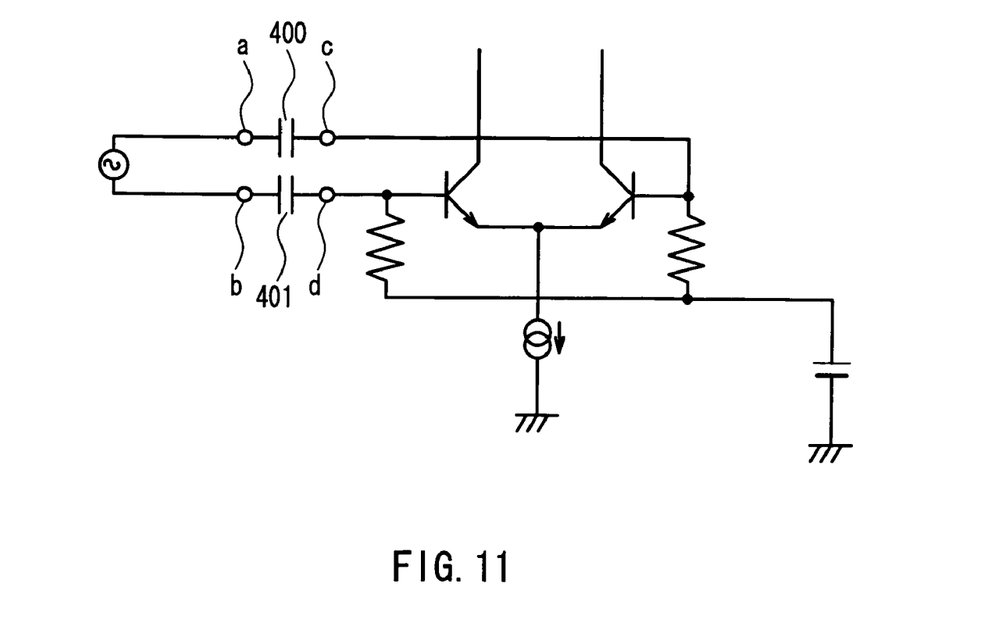
FIG. 11 is a circuit drawing showing a usage example of a MIM capacitor according to Embodiment 4.

FIG. 11 is a circuit drawing showing an example of use of the MIM capacitor 200 according to Embodiment 4. When the pair of capacitors of the MIM capacitor 200 shown in FIG. 9 are used as combined capacitance for inputting differential signals to the differential circuit shown in FIG. 11, the signals respectively applied to the points c and d corresponding to the electrodes of the capacitors 400 and 401 shown in FIGS. 10 and 11 have the same amplitude and are in antiphase. For this reason, the electrical charges charged to and discharged from a point 106, which indicates the metal area 3 via the parasitic capacitors 102 and 103 of the capacitors 400 and 401 counter each other and the total becomes zero. Accordingly, the electrical potential of the metal area 3 indicated by the point 106 goes into a state of an AC ground. A result of this is that there is no influence of the parasitic elements 104 and 105 present between the semiconductor substrate 20 and the point 106 which indicates the metal area 3 shown in FIG. 10. For this reason, there is no loss due to the influence of the semiconductor substrate 20 and no deterioration in the Q value of the capacitors, and problems such as phase displacement or gaps in amplitude of the two signals which are differential signals, thus enabling high-precision, high-quality circuit design.

Embodiment 5

Figure 12:
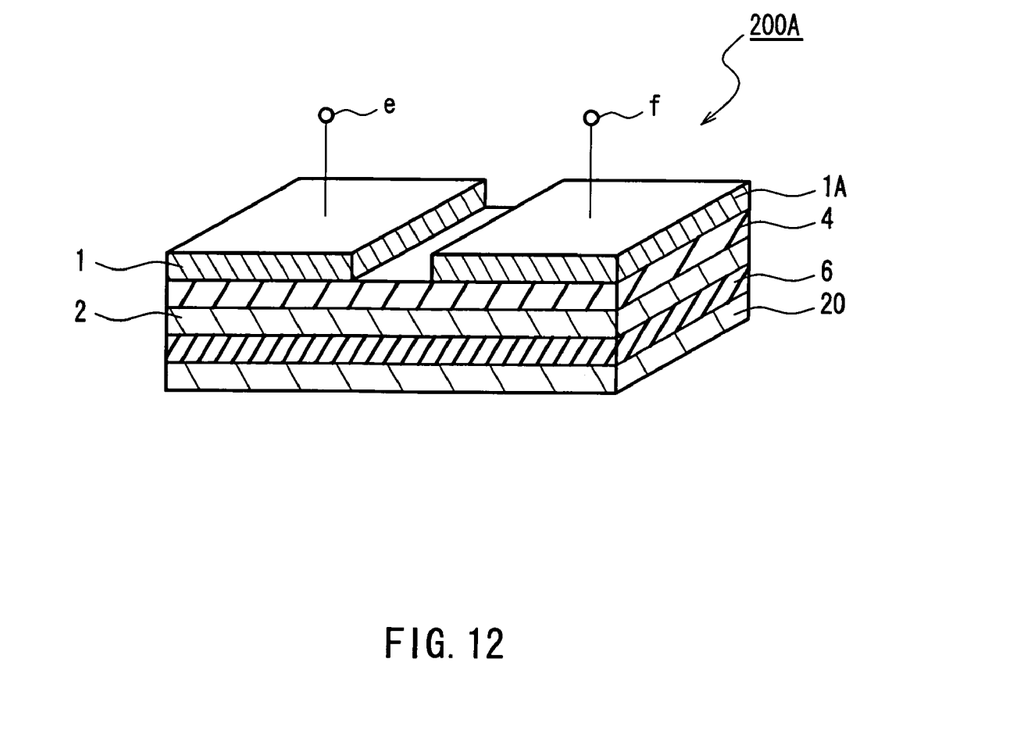
FIG. 12 is a cross-sectional perspective view of a configuration of a MIM capacitor according to Embodiment 5.

FIG. 12 is a cross-sectional perspective view of a configuration of a MIM capacitor 200A according to Embodiment 5. The same reference numbers are used for structural elements here that are the same as structural elements of the MIM capacitor 200 according to Embodiment 4, which was described with reference to FIG. 9. Accordingly, a detailed description of those structural elements is omitted here.

The MIM capacitor 200A is provided with a semiconductor substrate 20. Formed in order on the semiconductor substrate 20 are an insulating layer 6, a metal area 2, and an insulating layer 4. A metal area 1 and a metal area 1A are formed with a suitable spacing on the insulating layer 4.

Figure 13:
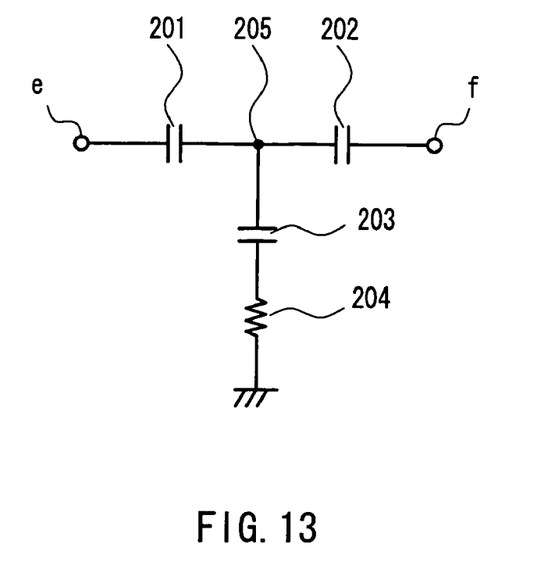
FIG. 13 is a circuit drawing showing a configuration of an equivalent circuit of the MIM capacitor according to Embodiment 5.

FIG. 13 is a circuit drawing showing a configuration of an equivalent circuit of the MIM capacitor 200A. The equivalent circuit includes a capacitor 201 that is configured by metal areas 1 and 2, and a capacitor 202 that is configured by metal areas 1A and 2. A point 205 corresponds to the metal area 2, which is common to the capacitors 201 and 202. The point 205 is serially connected to a parasitic capacitor 203 between the metal area 2, which is common to the capacitors 201 and 202 and the semiconductor substrate 20, and a loss resistor 204 of the parasitic capacitor 203.

Figure 16:
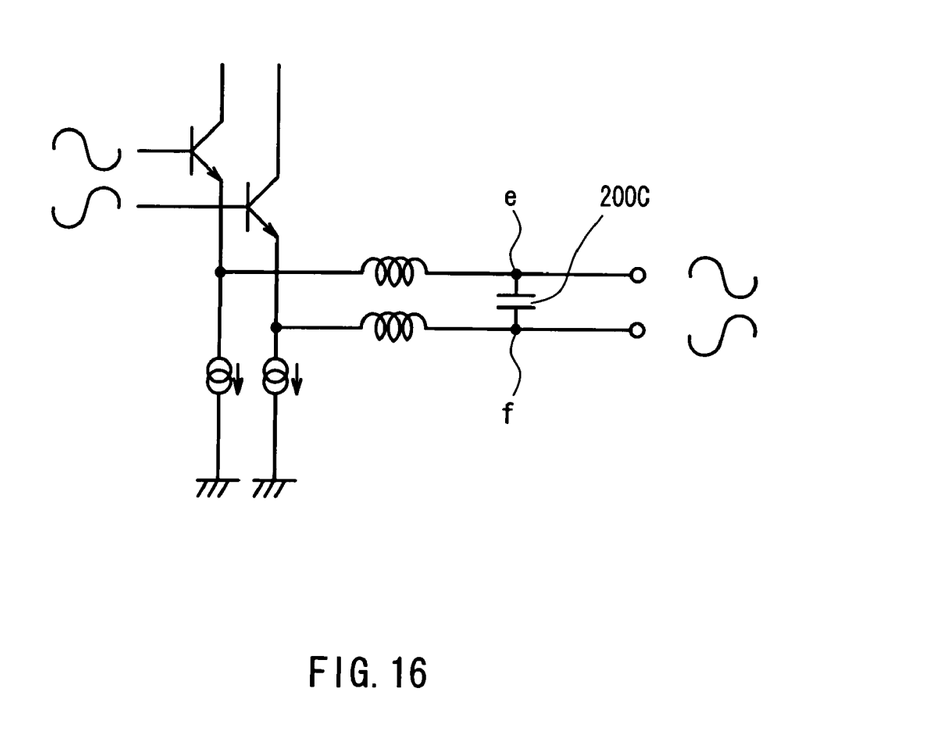
FIG. 16 is a circuit drawing showing an example of the use of a MIM capacitor according to Embodiment 7.

When the pair of capacitors of the MIM capacitor 200A shown in FIG. 12 are used as the capacitance for a filter circuit shown in FIG. 16, the electrical charges charged to and discharged from a point e and a point f corresponding to the metal areas of the capacitors 201 and 202 shown in FIG. 13 via the capacitors 201 and 202 cancel each other and the total becomes zero.

Accordingly, the electrical potential of the metal area 2 indicated by the point 205 goes into a state of an AC ground. The result of this is that there is no influence of the parasitic element 203 and the loss resistor 204 present between the semiconductor substrate 20 and the point 205 which indicates the metal area 2 shown in FIG. 12. For this reason, there is no loss due to the influence of the semiconductor substrate 20 and no deterioration in the Q value of the capacitors, and problems such as phase displacement or gaps in amplitude of the two signals, which are differential signals, do not occur, thus enabling high-precision, high-quality circuit design.

Embodiment 6

Figure 14:
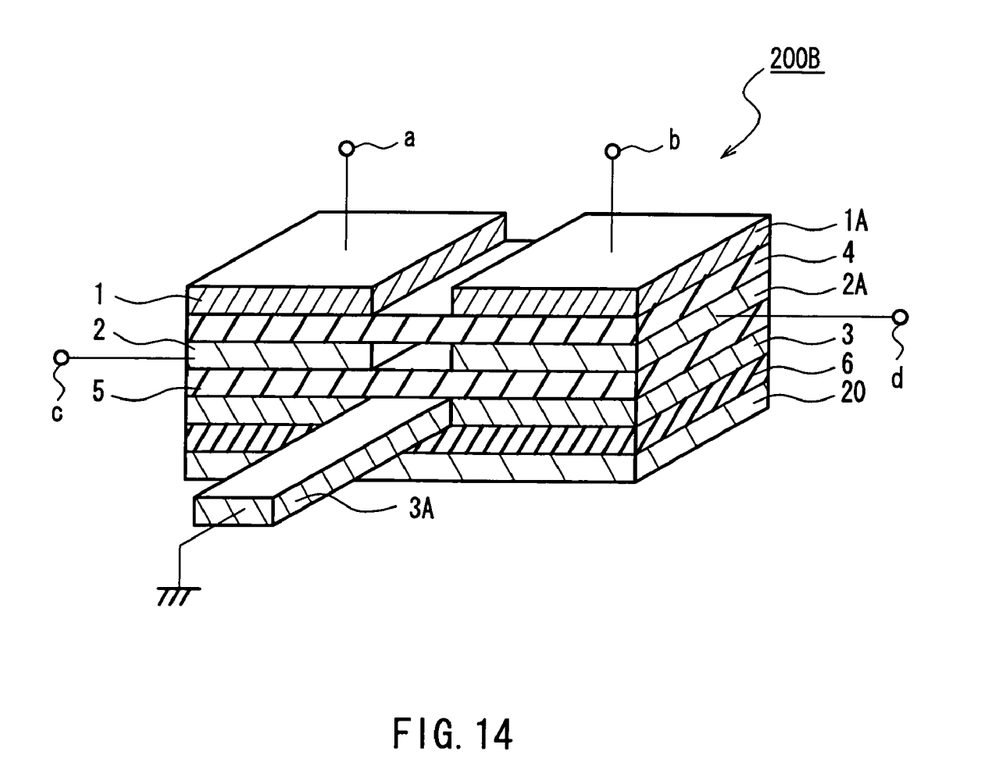
FIG. 14 is a cross-sectional perspective view of a configuration of a MIM capacitor according to Embodiment 6.

FIG. 14 is a cross-sectional perspective view of a configuration of a MIM capacitor 200B according to Embodiment 6. The same reference numbers are used for structural elements here that are the same as structural elements of the MIM capacitor 200 according to Embodiment 4, which was described with reference to FIG. 9. Accordingly, a detailed description of those structural elements is omitted here.

The difference from the MIM capacitor 200 according to Embodiment 4, which was described with reference to FIG. 9, is that a metal area 3 is connected to a ground potential by arranging a pull-out wiring 3A that connects the metal area 3 to a ground potential.

In the MIM capacitor 200 according to Embodiment 4, which was described with reference to FIGS. 9 and 10, when there is distortion in the signal applied to the capacitors 400 and 401, and when these have different amplitudes, a ripple voltage is produced in the metal area 3 such that the influence of the parasitic elements 104 and 105 shown in FIG. 10 is received slightly, and therefore the metal area 3 is connected to the ground potential via the pull-out wiring 3A.

It is preferable that the pull-out wiring 3A is connected to the ground potential at a connection point such that the impedance to the metal area 2 that constitutes the first capacitor and the impedance to the metal area 2A that constitutes the second capacitor are substantially equivalent so that the shielding effect of the metal area 3 can be strengthened still further. This is because the balance between the signal applied to the first capacitor and the signal applied to the second capacitor can be maintained.

Embodiment 7

Figure 15:
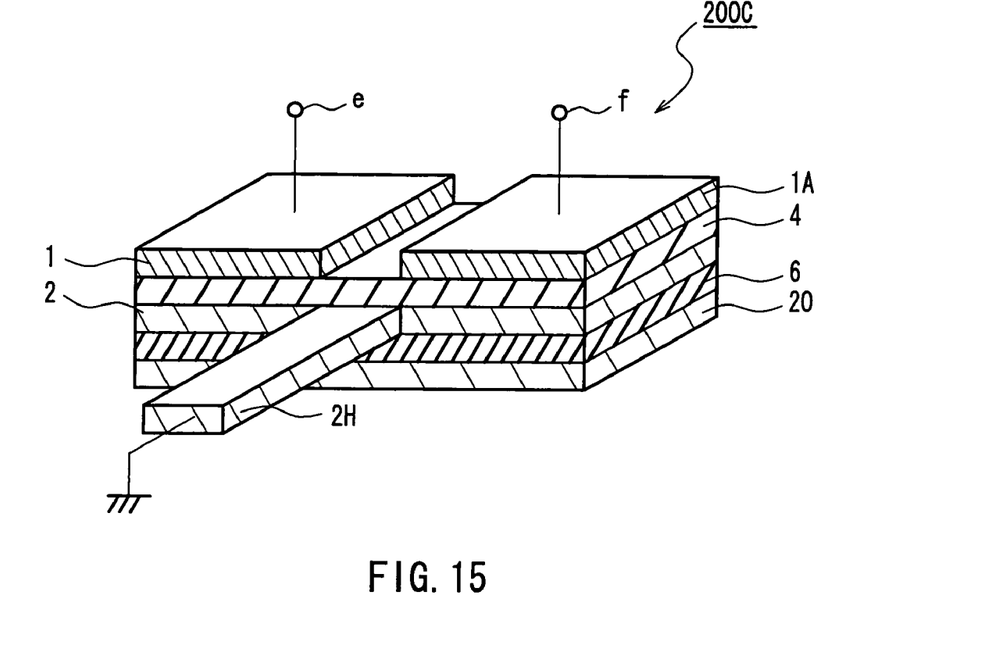
FIG. 15 is a cross-sectional perspective view of a configuration of a MIM capacitor according to Embodiment 7.

FIG. 15 is a cross-sectional perspective view of a configuration of a MIM capacitor 200C according to Embodiment 7. The same reference numbers are used for structural elements here that are the same as structural elements of the MIM capacitor 200A according to Embodiment 5, which was described with reference to FIG. 12. Accordingly, a detailed description of those structural elements is omitted here.

The difference from the MIM capacitor 200A according to Embodiment 5 is that a metal area 2 is connected to a ground potential by arranging a pull-out wiring 2H that connects the metal area 2 to a ground potential.

In the MIM capacitor 200A according to Embodiment 5, which was described with reference to FIGS. 12 and 13, when there is distortion in the signal applied to the capacitors 201 and 202, and when these have different amplitudes, a ripple voltage is produced in the metal area 2 such that the influence of the parasitic elements 203 and 204 shown in FIG. 13 is received slightly, and therefore the metal area 2 is connected to the ground potential via the pull-out wiring 2H.

It is preferable that the pull-out wiring 2H is connected to the ground potential at a connection point such that the impedance to the metal area 1 that constitutes the first capacitor and the impedance to the metal area 6 that constitutes the second capacitor are substantially equivalent so that the shielding effect of the metal area 2 can be strengthened still further. This is because the balance between the signal applied to the first capacitor and the signal applied to the second capacitor can be maintained. Moreover, it is also possible to arrange another different electrode on the metal areas 1 and 6 that form the upper portion electrode. Ripple removal can be performed when using configuration shown in FIG. 15 in a filter circuit shown in FIG. 16.

Embodiment 8

Figure 17:
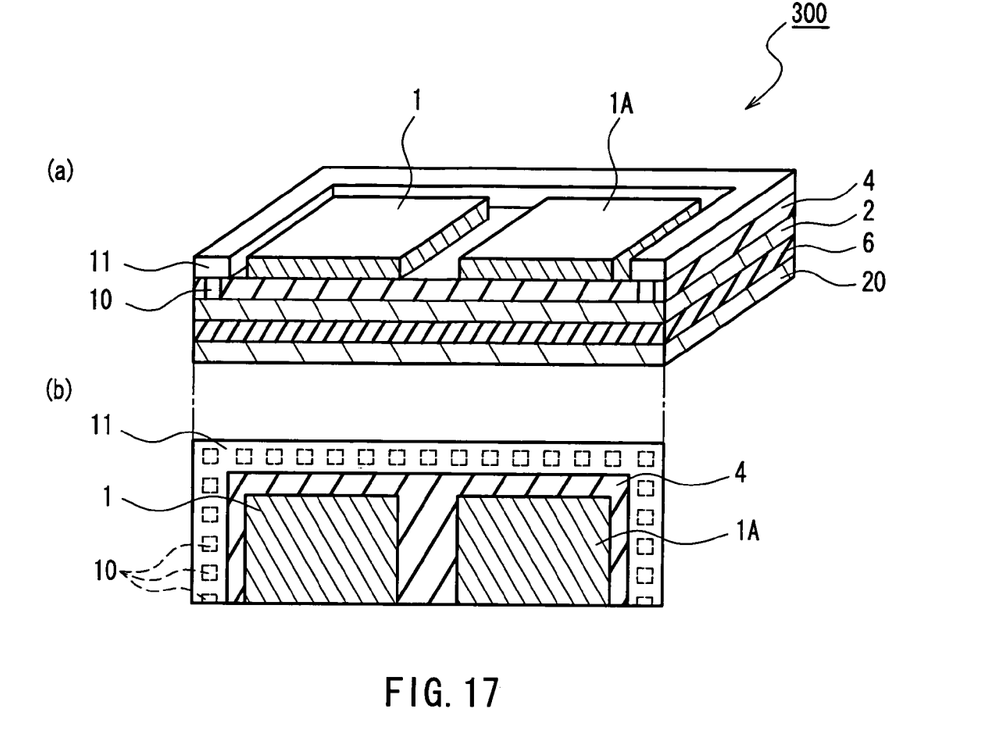
FIG. 17 shows a configuration of a MIM capacitor according to Embodiment 8.

FIG. 17 shows a configuration of a MIM capacitor 300 according to Embodiment 8. FIG. 17(a) shows a cross-sectional perspective view of the MIM capacitor 300 and FIG. 17(b) shows a top view of the MIM capacitor 300. The same reference numbers are used for structural elements here that are the same as structural elements of the MIM capacitor 200A according to Embodiment 5, which was described with reference to FIG. 12. Accordingly, a detailed description of those structural elements is omitted here.

The difference from the MIM capacitor 200A according to Embodiment 5 is that a guard electrode 11 and a contact 10 further are provided. The guard electrode 11 is formed on the insulating layer 4 so as to surround the metal area 1 and the metal area 1A. And the contact 10 is formed so as to connect the guard electrode 11 and the metal area 2 through the insulating layer 4. The shielding effect can be increased when the guard electrode 11 and the contact 10 such as these are provided.

The guard electrode 11 and the contact 10 may be provided in the MIM capacitor 200, 200A, 200B, and 200C according to the Embodiments 4 to 7.

Industrial Applicability

As described above, a high performance MIM capacitor can be formed according to the present invention.

The invention claimed is:

1. A MIM capacitor comprising:
a substrate;
a first metal area formed opposing the substrate;
a second metal area formed opposing the substrate, the second metal area being coplanar with the first metal area;
a third metal area formed between the first metal area and the substrate so as to oppose the first metal area;
a fourth metal area formed between the second metal area and the substrate so as to oppose the second metal area, the fourth metal area being coplanar with the third metal area; and
an insulating film formed between the first metal area and the third metal area, and between the second metal area and the fourth metal area;
wherein a first capacitance value is determined by opposing surface areas of the first metal area and the third metal area, and a second capacitance value is determined by opposing surface areas of the second metal area and the fourth metal area;
and further comprising a fifth metal area formed in an electrically floating state between the third and fourth metal areas and the substrate so as to oppose both the third metal area and the fourth metal area.

2. The MIM capacitor according to claim 1, wherein the fifth metal area is connected to a ground potential.

3. The MIM capacitor according to claim 2, wherein the fifth metal area is connected to the ground patental at a connection point such that impedance to the third metal area and impedance to the fourth metal area are substantially equivalent.

4. A MIM capacitor comprising:
a substrate;
a first metal area formed opposing the substrate;
a second metal area formed opposing the substrate, the second metal area being coplanar with to the first metal area;
a third metal area formed between the first metal area and the substrate so as to oppose first metal area;
a fourth metal area formed between the second metal area and the substrate so as to oppose the second metal area, the fourth metal area being coplanar with the third metal area; and
an insulating film formed between the first metal area and the third metal area, and between the second metal area and the fourth metal area;
wherein a first capacitance value is determined by opposing surface areas of the first metal area and the third metal area, and a second capacitance value is determined by opposing surface areas of the second metal area and the fourth metal area;
and further comprising a fifth area formed as a diffusion layer having conductivity in an electrically floating state between the third and fourth metal areas and the substrate so as to oppose both the third metal area and the fourth metal area.

* * * * *